United States Patent
Jung et al.

(10) Patent No.: US 10,921,209 B2
(45) Date of Patent: Feb. 16, 2021

(54) LIQUID SENSOR AND METHOD FOR CONTROLLING A FUNCTION OF A LIQUID SENSOR

(71) Applicant: Grohe AG, Hemer (DE)

(72) Inventors: Andreas Jung, Froendenberg (DE); Heiko Schoenbeck, Hemer (DE)

(73) Assignee: Grohe AG, Hemer (DE)

( * ) Notice: Subject to any disclaimer, the term of this patent is extended or adjusted under 35 U.S.C. 154(b) by 60 days.

(21) Appl. No.: 16/462,051

(22) PCT Filed: Nov. 17, 2017

(86) PCT No.: PCT/EP2017/001352
§ 371 (c)(1),
(2) Date: Jul. 31, 2019

(87) PCT Pub. No.: WO2018/091143
PCT Pub. Date: May 24, 2018

(65) Prior Publication Data
US 2019/0339153 A1 Nov. 7, 2019

(30) Foreign Application Priority Data
Nov. 18, 2016 (DE) .................. 10 2016 013 754

(51) Int. Cl.
*G01M 3/16* (2006.01)
*H04W 4/80* (2018.01)
*G08B 21/20* (2006.01)
*H03K 17/96* (2006.01)

(52) U.S. Cl.
CPC .............. *G01M 3/16* (2013.01); *G08B 21/20* (2013.01); *H03K 17/962* (2013.01); *H04W 4/80* (2018.02); *H03K 2017/9613* (2013.01); *H03K 2217/960755* (2013.01)

(58) Field of Classification Search
CPC .......... G01M 3/16; H04W 4/80; G08B 21/20; H03K 17/962; H03K 2017/9613; H03K 2217/960755
USPC ......................................................... 340/620
See application file for complete search history.

(56) References Cited

U.S. PATENT DOCUMENTS

| 3,942,167 | A | 3/1976 | McClintock | |
|---|---|---|---|---|
| 9,756,491 | B2 | 9/2017 | Virhiä | |
| 2001/0004240 | A1* | 6/2001 | Freill | G08B 21/20 340/625 |
| 2008/0150705 | A1 | 6/2008 | Al-Wakeel | |
| 2015/0276544 | A1* | 10/2015 | Osoinach | G01M 3/16 324/664 |

(Continued)

FOREIGN PATENT DOCUMENTS

| DE | 102004033804 A1 | 2/2006 |
|---|---|---|
| DE | 102015103617 A1 | 9/2016 |
| EP | 3021267 A1 | 5/2016 |

*Primary Examiner* — Joseph H Feild
*Assistant Examiner* — Sharmin Akhter
(74) *Attorney, Agent, or Firm* — Muncy, Geissler, Olds & Lowe, P.C.

(57) ABSTRACT

A liquid sensor, including: a) a housing; b) at least one sensor having at least two metallic contact surfaces for detecting a liquid; and c) a processing unit for processing sensor signals of the at least one sensor, a function of the liquid sensor being controllable by an actuation of at least one of the metallic contact surfaces. A method for controlling a function of a liquid sensor is also proposed.

10 Claims, 1 Drawing Sheet

(56) References Cited

U.S. PATENT DOCUMENTS

2017/0059444 A1\* 3/2017 Sagi ................. G01M 3/26
2018/0103361 A1 4/2018 Virhiä

\* cited by examiner

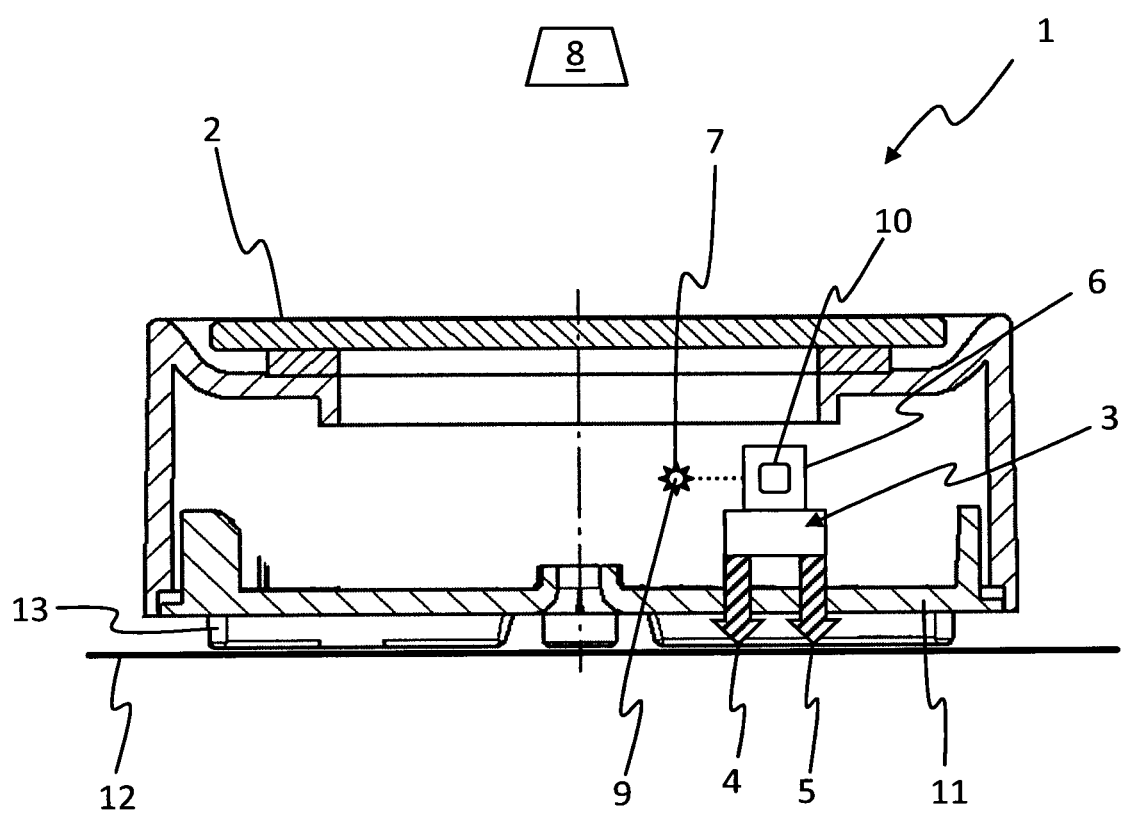

LIQUID SENSOR AND METHOD FOR CONTROLLING A FUNCTION OF A LIQUID SENSOR

This nonprovisional application is a National Stage of International Application No. PCT/EP2017/001352, which was filed on Nov. 17, 2017, and which claims priority to German Patent Application No. 10 2016 013 754.1, which was filed in Germany on Nov. 18, 2016, and which are both herein incorporated by reference.

BACKGROUND OF THE INVENTION

Field of the Invention

The present invention relates to a liquid sensor, with the aid of which a leak in pipes or equipment is detectable. The present invention also relates to a method for controlling a function of a liquid sensor of this type.

Description of the Background Art

A liquid sensor is known from EP 3 021 267 A1, which is connectable to a receiver via a radio link. If a leak is detected, an alarm indication may be signaled to a mobile device of a user via the receiver and a server, using the radio link. To set up the radio link, the liquid sensor may be registered on the receiver or coupled with the receiver. The so-called Wi-Fi Protected Setup (WPS) protocol is frequently used for simplified registration. In this case, a key must be pressed on the liquid sensor and the receiver to initiate the registration or coupling process. This key must be provided with a water-proof and dust-proof design on the liquid sensor to avoid damage to the liquid sensor due to water or dust. However, equipping the liquid sensor with a key of this type results in high installation complexity and costs.

SUMMARY OF THE INVENTION

The object of the invention is therefore to at least partially solve the problems described with respect to the prior art and, in particular, to specify a liquid sensor, in which a function of the liquid sensor is controllable without a mechanical key. A method for controlling a function of a liquid sensor is also to be specified, in which the control of the function takes place without a mechanical key.

These objects are achieved by a liquid sensor and a method according to the features of the independent patent claims. Additional advantageous embodiments of the invention are specified in the dependently worded patent claims. It should be noted that the features discussed individually in the dependently worded patent claims may be combined with each other in any technologically reasonable manner and define additional embodiments of the invention. Moreover, the features specified in the patent claims are defined more precisely and explained in the description, additional preferred embodiments of the invention being illustrated.

The liquid sensor according to the invention includes at least the following components:
a) a housing;
b) at least one sensor having at least two metallic contact surfaces for detecting a liquid;
c) a processing unit for processing sensor signals of the at least one sensor,
 a function of the liquid sensor being controllable by an actuation of at least one of the metallic contact surfaces.

The proposed liquid sensor is used to detect leaks in liquid-conducting lines or devices, for example washing machines or dishwashers or their supply lines. For this purpose, the liquid sensor is positioned on a floor, in particular in the area of a liquid-conducting line of this type or a liquid-conducting devices of this type. The liquid sensor includes a housing, which comprises at least one sensor having at least two metallic contact surfaces for detecting a liquid, for example water. The at least two metallic contact surfaces are designed, in particular, in the manner of contact pins and/or measuring electrodes. The at least two metallic contact surfaces are designed, in particular, in the manner of at least two measuring electrodes. The presence or absence of the liquid is detectable, in particular, via a change in the resistance between the at least two metallic contact surfaces. The at least two metallic contact surfaces also extend, in particular, through a housing base of the housing and/or in the direction of the floor on which the liquid sensor is placed. Feet may be provided on the housing base, which position the housing base at a distance from the floor, so that the liquid is able to contact the at least two metallic contact surfaces between the housing base and the floor.

The liquid sensor furthermore includes a processing unit for processing sensor signals of the at least one sensor. The sensor signals are, in particular, electrical signals or data of the at least one sensor. The processing unit is, in particular, a (digital) electronic assembly.

The control of a function of the liquid sensor, for example a switching of the liquid sensor on and off, an activation or deactivation of a sensor of the liquid sensor or a registration or coupling of the liquid sensor with a receiving unit, advantageously takes place by actuating the at least one metallic contact surface. The actuation of the at least one metallic contact surface takes place, in particular, by a user of the liquid sensor touching the at least one metallic contact surface and/or spatially displacing it with respect to the housing. The liquid sensor therefore does not require a separate (mechanical) key to control the function of the liquid sensor. Instead, the at least one metallic contact surface is used as a "key."

It is also advantageous if the liquid sensor includes a wireless unit for transmitting the sensor signals to a receiving unit, the wireless unit being able to be coupled with the receiving unit by actuating at least one of the metallic contact surfaces. The wireless unit is, in particular, a Bluetooth or WLAN module, with the aid of which the sensor signals of the at least one sensor are transmittable to the receiving unit. The receiving unit may be, for example, an access point, a hub, a router or another wireless unit. The wireless unit may be able to be coupled with the receiving unit by actuating or touching at least one of the at least two metallic contact surfaces. The coupling takes place, in particular, according to the Wi-Fi Protected Setup (WPS) method, with the aid of which a wireless local network may be set up between the liquid sensor and the receiving unit.

It is furthermore advantageous if the wireless unit comprises at least one high-frequency unit. This makes it possible, in particular, to operate the wireless unit in a wireless network according to the industrial standards of the IEEE-802.11 family or IEEE 802.15.x (IEEE 802.15.1: Bluetooth, IEEE 802.15.2: ZigBee, etc.).

It is also advantageous if the processing unit is configured to identify an actuation of the at least one metallic contact surface.

After activating an energy source of the liquid sensor, for example after inserting one or multiple batteries, the sensor monitors a short-circuiting of the metallic contact surfaces within a certain period of time, e.g. two minutes. If a short-circuit occurs within this period of time, the short-circuit is not evaluated as a leak or flooding but is used to control a function of the liquid sensor, for example to switch on the WLAN module and to initiate the process of connecting to the receiver. In addition, the wireless unit or the WLAN module may also be placed into operation in the so-called mixed access point/station mode AP/STA mode by an actuation of the at least one metallic surface. A user may now connect to an access point of the installation (appliance) with the aid of a mobile device, such as a smartphone. In parallel thereto, a WLAN module configured via a software application, for example via a mobile app, may contact another access point (WLAN router) in parallel to the self-initiated access point and thereby test the connection to the cloud server and report the result directly back to the mobile device. After the configuration has been completed, the access point and station mode are closed by the appliance. If a leak or a water alarm or the like occurs, the wireless unit or the WLAN module may then be placed into operation without any further configuration. The latter operates in the previously configured station mode and contacts first the WLAN router and then the cloud server.

It is furthermore advantageous if at least one analog input or one digital input of the processing unit is used to identify an actuation of the at least one metallic contact surface. A threshold switch, in particular, may be used. For this purpose, for example, a capacitor is charged to a certain potential via a charging circuit. An output signal is raised to a certain potential via a transistor configuration. In this case, one of the two metallic contact surfaces is connected to the capacitor. Its electrical potential is that of the capacitor after a certain period of time. If a low-impedance connection is now set up between the two contact surfaces, e.g. due to a conductive liquid, the potential at the capacitor drops. The more conductive the liquid between the metallic contact surfaces or contact pins, the faster the electrical potential drops at the capacitor. Resupplying the capacitor via the charging circuit is slower. If the potential at the capacitor drops below a certain value, the potential at the transistor output changes. This change is detected by an interrupt-triggering input of the microcontroller. The interrupt causes a triggering of an alarm indication to the cloud.

It is furthermore advantageous if the processing unit comprises at least one microcontroller. The microcontroller is designed, in particular, in the manner of a CPU.

It is also advantageous if the at least two metallic contact surfaces are not movable relative to the housing. In other words, the at least two metallic contact surfaces have a fixed design. This makes it possible to particularly easily protect the housing against a penetration of a liquid or dust.

According to another aspect of the invention, a method for controlling a function of a liquid sensor is also specified, the control of the function taking place by an actuation of at least one of at least two metallic contact surfaces of a sensor for detecting a liquid. The method is used, in particular, to control a function of a liquid sensor according to the invention. Reference is therefore made to the description of the liquid sensor according to the invention for further details.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING

The present invention will become more fully understood from the detailed description given hereinbelow and the accompanying drawing which is given by way of illustration only, and thus, is not limitive of the present invention, and wherein the sole figure schematically shows a longitudinal sectional view of a liquid sensor by way of example.

DETAILED DESCRIPTION

The sole figure shows a longitudinal sectional view of a liquid sensor 1, which in the sole figure is disposed on a floor 12 in the vicinity of a liquid line, which is not illustrated here. Liquid sensor 1 includes a housing 2 having a sensor 3. Sensor 3 comprises a first metallic contact surface 4 and a second metallic contact surface 5, which are designed in the manner of measuring electrodes and extend through a housing base 11 of housing 2 in the direction of floor 12, so that a liquid is able to contact first metallic contact surface 4 and second metallic contact surface 5 between housing base 11 and floor 12 if a leak occurs in the water line. The housing base also includes two feet 13, which position housing base 11 at a distance from floor 12. First metallic contact surface 4 and second metallic contact surface 5 are designed to be fixed relative to the housing. In addition, first metallic contact surface 4 and second metallic contact surface 5 may be actuated or touched by a user outside housing 2 to control a function of liquid sensor 1 if liquid sensor 1 is not placed on floor 12. Sensor 3 is connected to a processing unit 6 for processing sensor signals of sensor 3 and for identifying an actuation of first metallic contact surface 4 and second metallic contact surface 5. Processing unit 6 includes a microcontroller 10 for this purpose. Processing unit 6 is also data-conductively connected to a wireless unit 7, which comprises a high-frequency unit 9. The sensor signals of sensor 3 are transmittable over a wireless network to a receiving unit 8 with the aid of wireless unit 7. Upon an actuation of first metallic contact surface 4 and/or second metallic contact surface 5 by a user, wireless unit 7 may be coupled with receiving unit 8 by processing unit 6 according to the WPS method.

The present invention is characterized, in particular, in that a function of liquid sensor 1 is controllable without a separate (mechanical) key.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:
1. A liquid sensor, including:
a) a housing;
b) at least one sensor having at least two metallic contact surfaces for detecting a liquid;
c) a processing unit for processing sensor signals of the at least one sensor,
wherein a function of the liquid sensor, other than the detecting of the liquid, is controllable by an actuation of at least one of the at least two metallic contact surfaces in which a user touches the at least one of the at least two metallic contact surfaces, such that the at least two metallic contact surfaces are provided for the detecting of the liquid and are actuatable by touch from the user for control of the function other than the detecting of the liquid.

2. The liquid sensor according to claim 1, including a wireless unit for transmitting the sensor signals to a receiving unit that is disposed remote from the liquid sensor, wherein the wireless unit may be coupled to the receiving unit by an actuation of the at least one of the metallic contact surfaces.

3. The liquid sensor according to claim 2, wherein the wireless unit comprises at least one high-frequency unit.

4. The liquid sensor according to claim 1, wherein the processing unit is configured to identify an actuation of at least one of the at least two metallic contact surfaces.

5. The liquid sensor according to claim 1, wherein at least one analog input or one digital input of the processing unit is used to identify an actuation of at least one of the at least two metallic contact surfaces.

6. The liquid sensor according to claim 1, wherein the processing unit comprises at least one microcontroller.

7. The liquid sensor according to claim 1, wherein the at least two metallic contact surfaces are unmovable relative to the housing.

8. The liquid sensor according to claim 1, wherein the function other than the detecting of the liquid includes at least one of switching the liquid sensor on or off, an activation or deactivation of the at least one sensor of the liquid sensor, or a registration or a coupling of the liquid sensor with a remote receiving unit.

9. A method for controlling a function of a liquid sensor other than a detection of a liquid, the liquid sensor having at least one sensor having at least two metallic contact surfaces for the detection of the liquid, the method comprising:

actuating at least one of the at least two metallic contact surfaces by a user touching the at least one of the at least two metallic contact surfaces to control the function of the liquid sensor that is other than the detection of the liquid.

10. The method according to claim 9, wherein the function other than the detection of the liquid includes at least one of switching the liquid sensor on or off, an activation or deactivation of the at least one sensor of the liquid sensor, or a registration or a coupling of the liquid sensor with a remote receiving unit.

* * * * *